United States Patent
Ham et al.

(10) Patent No.: US 9,874,617 B2
(45) Date of Patent: Jan. 23, 2018

(54) SWITCHING-FREQUENCY-CONTROLLED SWITCH-MODE POWER SUPPLY UNIT FOR POWERING MAGNETIC RESONANCE SYSTEM GRADIENT COILS

(71) Applicant: KONINKLIJKE PHILIPS N.V., Eindhoven (NL)

(72) Inventors: Cornelis Leonardus Gerardus Ham, Eindhoven (NL); Martin Alexander Hollander, Eindhoven (NL); Marinus Johannes Adrianus Maria Van Helvoort, Eindhoven (NL); Michael Paul Bax, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 539 days.

(21) Appl. No.: 14/402,585

(22) PCT Filed: May 14, 2013

(86) PCT No.: PCT/IB2013/053909
§ 371 (c)(1),
(2) Date: Nov. 20, 2014

(87) PCT Pub. No.: WO2013/179169
PCT Pub. Date: Dec. 5, 2013

(65) Prior Publication Data
US 2015/0137810 A1    May 21, 2015

Related U.S. Application Data

(60) Provisional application No. 61/652,875, filed on May 30, 2012.

(51) Int. Cl.
*G01V 3/00* (2006.01)
*G01R 33/38* (2006.01)
(Continued)

(52) U.S. Cl.
CPC ......... *G01R 33/38* (2013.01); *G01R 33/3852* (2013.01); *G01R 33/46* (2013.01)

(58) Field of Classification Search
CPC .................................................. G01R 33/3852
(Continued)

(56) References Cited

U.S. PATENT DOCUMENTS 5,200,703 A     4/1993 Popp
5,546,001 A     8/1996 Miura
(Continued)

FOREIGN PATENT DOCUMENTS

JP     5253207 A     10/1993
JP     2002224079 A     8/2002
(Continued)

*Primary Examiner* — Louis Arana

(57) ABSTRACT

A power supply unit (130) powers at least one gradient coil (128) of a magnetic resonance (MR) examination system (110) with a main magnet (114) having, in at least one state of operation, a substantially static magnetic field strength, and with an MR measurement signal bandwidth. The power supply unit (130) includes a switched-mode power converter (134) for powering the at least one gradient coil (128), and including at least one switching member provided to switch between a conducting state configuration and an essentially non-conducting state configuration at a first fundamental switching frequency (fSW). A pulse control unit (132) is designed to provide switching pulses at the first fundamental switching frequency (fSW) for controlling the switching of the at least one switching member. Upon triggering by a trigger signal (142), the pulse control unit (132) is provided to change the first fundamental switching frequency (fSW) to at least a second fundamental switching frequency (fSW).

6 Claims, 5 Drawing Sheets

(51) Int. Cl.
*G01R 33/385* (2006.01)
*G01R 33/46* (2006.01)

(58) Field of Classification Search
USPC .................................................. 324/322, 318
See application file for complete search history.

(56) References Cited

U.S. PATENT DOCUMENTS

| | | | |
|---|---|---|---|
| 5,610,521 A | 3/1997 | Zou | |
| 5,663,647 A | 9/1997 | Wirth | |
| 7,053,617 B2 | 5/2006 | Havens | |
| 7,253,625 B2 | 8/2007 | Trabbic | |
| 9,322,890 B2* | 4/2016 | Xu | G01R 33/3852 |
| 9,389,288 B2* | 7/2016 | Sabate | G01R 33/3852 |
| 2015/0130464 A1* | 5/2015 | Huisman | H02M 7/493 |
| | | | 324/322 |
| 2015/0276904 A1* | 10/2015 | Grodzki | A61B 5/055 |
| | | | 324/309 |

FOREIGN PATENT DOCUMENTS

| | | |
|---|---|---|
| JP | 2003348829 A | 12/2003 |
| WO | 2009104116 A1 | 8/2009 |
| WO | 2011070466 A1 | 6/2011 |

\* cited by examiner

SWITCHING-FREQUENCY-CONTROLLED SWITCH-MODE POWER SUPPLY UNIT FOR POWERING MAGNETIC RESONANCE SYSTEM GRADIENT COILS

CROSS-REFERENCE TO PRIOR APPLICATIONS

This application is the U.S. National Phase application under 35 U.S.C. § 371 of International Application No. PCT/IB2013/053909, filed on May 14, 2013, which claims the benefit of U.S. Provisional Patent Application No. 61/652,875, filed on May 30, 2012. These applications are hereby incorporated by reference herein.

FIELD OF THE INVENTION

The invention pertains to a power supply unit for powering a gradient coil of a magnetic resonance (MR) examination system and a method of operating a power supply unit by controlling a switching frequency.

BACKGROUND OF THE INVENTION

In the art of magnetic resonance imaging (MRI) it is known to use switched-mode power converters to power gradient coils of MR examination systems. Switched-mode power converters use pulse width-modulation (PWM) at a fixed effective fundamental switching frequency, for instance in the range of 20-100 kHz. Higher harmonics of the fixed effective fundamental switching frequency might interfere with MR measurement signals within a measurement signal bandwidth of MR imaging and/or spectroscopy, for either protons (hydrogen nuclei) or other nuclei, thereby deteriorating an MR measurement signal quality. The switched-mode power converter commonly is equipped with an output filter for each gradient coil axis to attain a sufficient attenuation of the higher harmonics.

In multi-species nuclei MR scanning, an MR measurement signal frequency can be as low as 4.6 MHz, e.g. for $^{14}N$ at a magnetic field strength of the main magnet of the MR examination system of 1.5 T. In cases like this it will become difficult to attain sufficient attenuation of the higher harmonics. Too much filtering might result in too much loss of a gradient coil power amplitude. This is a disadvantage since the purpose of the power supply unit is to deliver as much power to the gradient coil(s) as possible. As another drawback, the power loss results in power dissipation within the filter which must therefore be cooled, so that additional hardware becomes necessary, incurring additional costs.

The problem is especially pronounced in multi-species nuclei MR measurements, in which the MR measurement signal frequencies lie within an MR measurement signal frequency range of relatively narrow bandwidth of, for instance, a few hundred Hz. An unavoidable temporal drift of the magnetic field strength of the main magnet will change the MR measurement signal frequencies, so that one of the harmonics of the fundamental switching frequency might fall into the frequency MR measurement signal frequency range.

It is therefore desirable to avoid this type of interference in MR examinations systems.

SUMMARY OF THE INVENTION

It is therefore an object of the invention to provide a power supply unit for powering at least one gradient coil of a magnetic resonance (MR) examination system with a main magnet having, in at least one state of operation, a substantially static magnetic field strength and with an MR measurement signal bandwidth, that avoids an aforementioned interference between the MR measurement signals and higher harmonics of a fundamental switching frequency.

In one aspect of the present invention, the object is achieved by a power supply unit comprising:

a switched-mode power converter for powering the at least one gradient coil, comprising at least one switching member provided to switch between a conducting state configuration and an essentially non-conducting state configuration at a first fundamental switching frequency;

a pulse control unit designed to provide switching pulses at the first fundamental switching frequency for controlling the switching of the at least one switching member;

wherein, upon triggering by a trigger signal, the pulse control unit is provided to change the first fundamental switching frequency to at least a second fundamental switching frequency.

Thereby, interference between MR measurement signals and harmonics of the fundamental switching frequency can be avoided and an MR measurement signal quality can be improved.

In another aspect of the present invention, the pulse control unit is provided to change the first fundamental switching frequency at least twice by a pre-determined amount. By that, an easy and cost-effective realization of a solution to improve the MR measurement signal quality by avoiding interference can be achieved. Preferably, a number of equal to or more than three potential fundamental switching frequencies is arranged for. Improving the MR measurement signal quality can then be carried out by trial and error under in-situ conditions.

In yet another aspect of the present invention, the pulse control unit is provided to determine an amount for the first fundamental switching frequency to be changed by from the type of nucleus under examination, the strength of the static magnetic field strength of the main magnet, and the first fundamental switching frequency. Thereby, a purposeful and directed determination of the amount of change in frequency can be conducted and a time for improving the MR measurement signal quality can be shortened.

In a preferred embodiment, the power supply unit further comprises a fundamental switching frequency selection unit, wherein the fundamental switching frequency selection unit is designed to provide the trigger signal to the pulse control unit to change the first fundamental switching frequency to at least a second fundamental switching frequency, upon manual actuation of the fundamental switching frequency selection unit by an operator. This can allow for an easy and cost-effective realization of a solution to improve the MR measurement signal quality by avoiding interference.

An in-situ improvement of the MR measurement signal quality by manually selecting a fundamental switching frequency, a harmonic of which does not interfere with the MR measurement signal, can be obtained by furnishing the fundamental switching frequency selection unit with a selection member for selecting a fundamental switching frequency, wherein the fundamental switching frequency selection unit is further designed to provide the trigger signal to the pulse control unit as long as the operator is activating the selection member. The selecting member may be designed as a (momentary) push-button, a soft key on a computer screen, a slide control, or any other member that appears to be suitable to the one of skills in the art. Preferably, the selection member may comprise a set of fundamental switching frequencies to select from, each of the switching frequencies being optimized with regard to some beneficial property, such like stability of operation.

In a further aspect of the invention, the power supply unit further comprises an interference indication unit provided to receive an input signal that corresponds to an amplitude of a harmonic of the first fundamental switching frequency within the MR measurement signal bandwidth, and designed to generate the trigger signal and to provide the trigger signal to the pulse control unit if the amplitude of the harmonic exceeds a pre-determined threshold. The input signal received by the interference indication unit may preferably be provided by another control unit of the MR examination system. Thereby, it can be attained that a change of the first fundamental switching frequency is carried out only if required for an improvement of the MR measurement signal quality. Further, a level of interference between the MR measurement signals and the higher harmonics of the fundamental switching frequency can be continuously controlled to prevent a sudden deterioration of the signal quality in the course of an MR examination due to a drift of the magnetic field strength of the main magnet.

It is another object of the invention to provide a magnetic gradient system of a magnetic resonance (MR) examination system, comprising at least one of the aforementioned embodiments of a power supply unit, and at least one gradient coil. By that, a magnetic gradient system may be realized that avoids encoding errors and hence image artifacts due to low signal-to-noise ratio, thus providing a reliable and faultless spatial encoding of a magnetic resonance signal of the MR examination system.

In another aspect, the invention is related to a method of operating a power supply unit, particularly for powering at least one gradient coil of a magnetic resonance (MR) examination system with a main magnet having, in at least one state of operation, a substantially static magnetic field strength and with an MR measurement signal bandwidth, the power supply unit comprising a switched-mode power converter for powering the at least one gradient coil, comprising at least one switching member provided to switch between a conducting state configuration and an essentially non-conducting state configuration at a first fundamental switching frequency;

a pulse control unit designed to provide switching pulses at the first fundamental switching frequency for controlling the switching of the at least one switching member;

wherein, upon triggering by a trigger signal, the pulse control unit is provided to change the first fundamental switching frequency at least to a second fundamental switching frequency, the method comprising the following steps:

determine an amplitude of a harmonic of the first fundamental switching frequency within the MR measurement signal bandwidth;

provide a trigger signal to the pulse control unit if the amplitude of the harmonic exceeds a pre-determined threshold; and upon being triggered by the trigger signal, the pulse control unit changes the first fundamental switching frequency at least to a second fundamental switching frequency.

In yet another aspect, the invention is related to a software module provided for operating a power supply unit, particularly a power supply unit for powering at least one gradient coil of a magnetic resonance (MR) examination system with a main magnet having, in at least one state of operation, a substantially static magnetic field strength and with an MR measurement signal bandwidth. The power supply unit is furnished with a switched-mode power converter for powering the at least one gradient coil, comprising at least one switching member provided to switch between a conducting state configuration and an essentially non-conducting state configuration at a first fundamental switching frequency, a pulse control unit designed to provide switching pulses at the first fundamental switching frequency for controlling the switching of the at least one switching member. Upon triggering by a trigger signal, the pulse control unit is provided to change the first fundamental switching frequency at least to a second fundamental switching frequency, so as to carry out the following steps:

determine an amplitude of a harmonic of the first fundamental switching frequency within the MR measurement signal bandwidth;

provide a trigger signal to the pulse control unit if the amplitude of the harmonic exceeds a pre-determined threshold; and upon being triggered by the trigger signal, the pulse control unit changes the first fundamental switching frequency at least to a second fundamental switching frequency;

wherein the steps of the method are converted into a program code that is implementable in and executable by the pulse control unit of the power supply unit.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

This description contains several embodiments of the invention. The individual embodiments are described with reference to particular groups of figures and are identified by a prefix number of the particular embodiment. Features the function of which is the same or basically the same in all embodiments are identified by reference numbers made up of the prefix number of the embodiment to which it relates, followed by the number of the feature.

Figure 1:
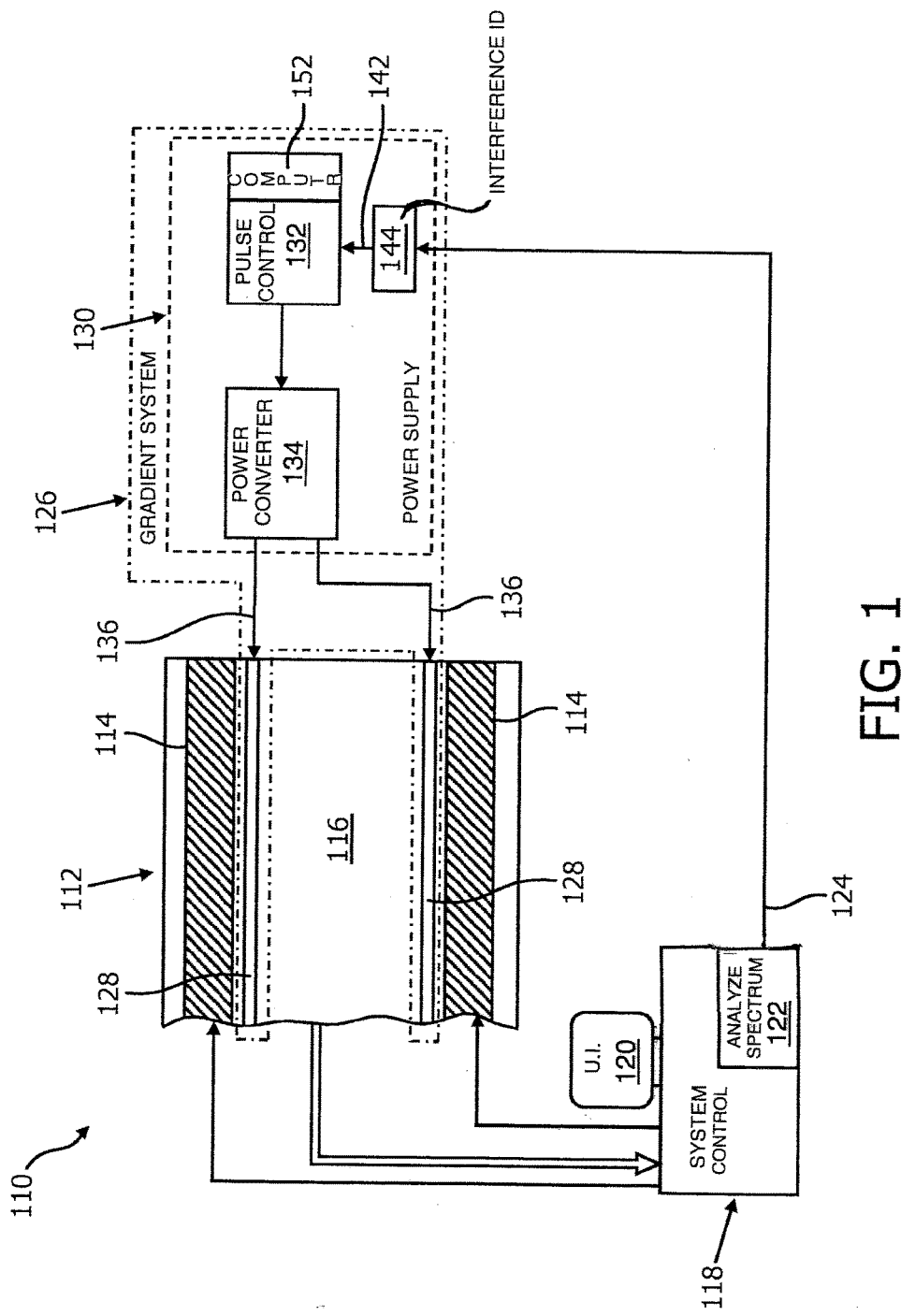
FIG. 1 shows a block diagram of a magnetic resonance (MR) examination system comprising a magnetic gradient system with a power supply unit in accordance with the invention.

FIG. 1 shows a block diagram of a magnetic resonance (MR) examination system 110 comprising an MR scanner 112, and a magnetic gradient system 126 with a power supply unit 130 in accordance with the invention and a gradient coil 128. The MR examination system 110 includes a main magnet 114 having, in at least one state of operation, a substantially static magnetic field strength showing a temporal drift due to unavoidable losses in the superconducting main magnet operated in a persistent-mode and to varying environmental conditions. The main magnet 114 has a bore that provides a region of examination 116 for a subject, usually a patient, to be arranged in. The gradient coil 128 is concentrically arranged within the bore of the main magnet 114. An MR system control unit 118 of the MR examination system 110 with a monitoring unit 120 is provided to control the functions of the MR scanner 112 as is commonly known in the art.

Figure 2:
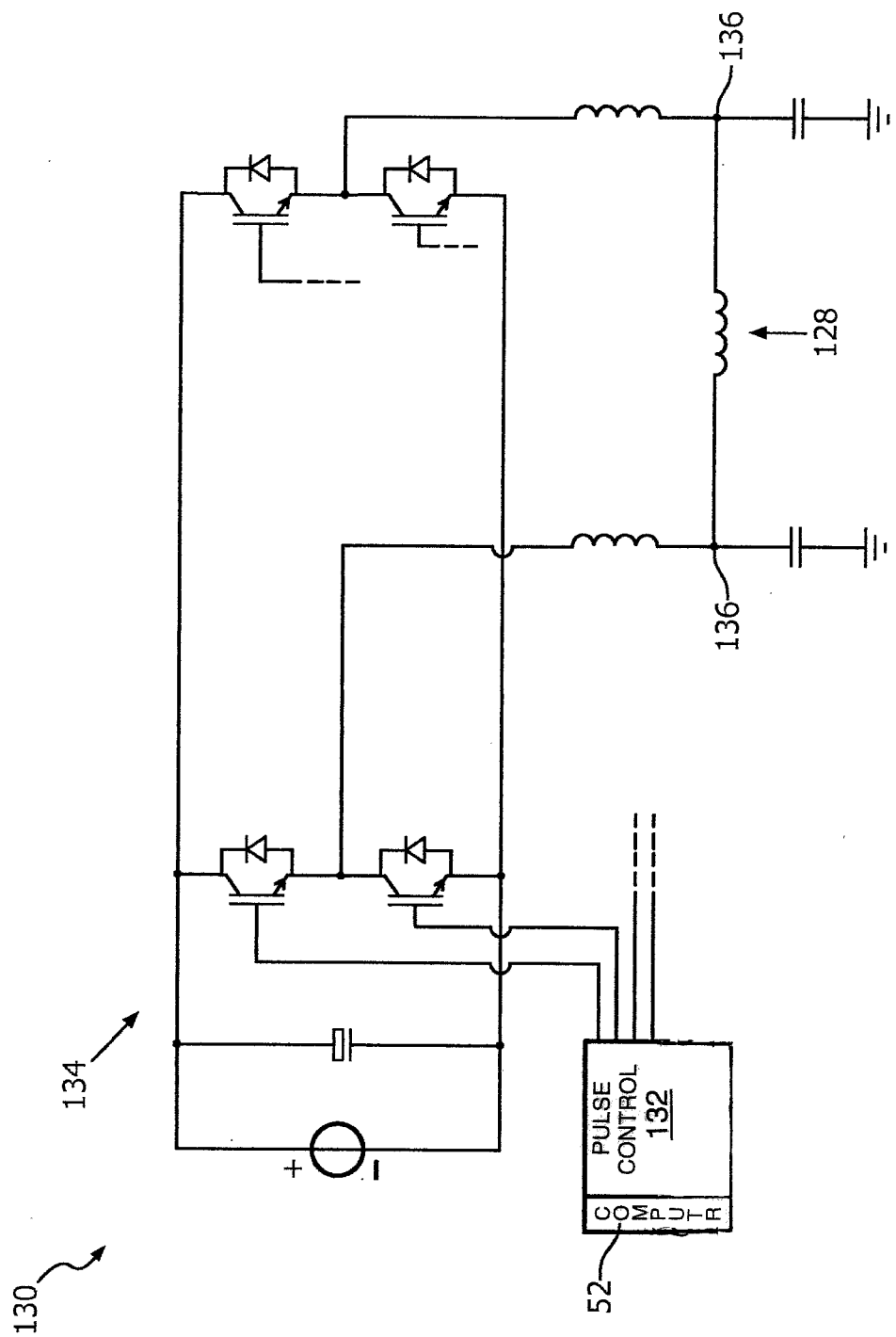
FIG. 2 illustrates a schematic view of details of the power supply unit pursuant to FIG. 1.

FIG. 2 illustrates a schematic view of details of the power supply unit 130 pursuant to FIG. 1. The power supply unit 130 comprises a switched-mode power converter 134 for powering the gradient coil 128. The switched-mode power converter 134 comprises two pairs of essentially identical switching members that are designed as an H bridge, as commonly known by the one of skills in the art. The switching members are formed by semiconductor switches and are provided to switch according to a pulse width-modulation (PWM) control between a conducting state configuration and an essentially non-conducting state configuration at a first fundamental switching frequency $f_{SW}$ and in a pre-determined temporal relationship to each other, as is well known to the one of skills in the art.

The power supply unit 130 comprises a pulse control unit 132 designed to provide switching pulses at the first fundamental switching frequency $f_{SW}$ for controlling the switching of the switching members. For the sake of clarity, lines required to transport the switching pulses from the pulse control unit 132 to the semiconductor switches are only hinted at in FIG. 2.

The semiconductor switches are shown in FIG. 2 as IGBTs, but could in general be designed as MOSFETs, or any other semiconductor switch that appears suitable to the one of skills in the art.

The gradient coil 128 is connected with each of its two ends to power output ports 136 constituted by two nodes, so that a current flowing through the gradient coil 128 is a low pass-filtered current of the H bridge output lines.

Figure 3:
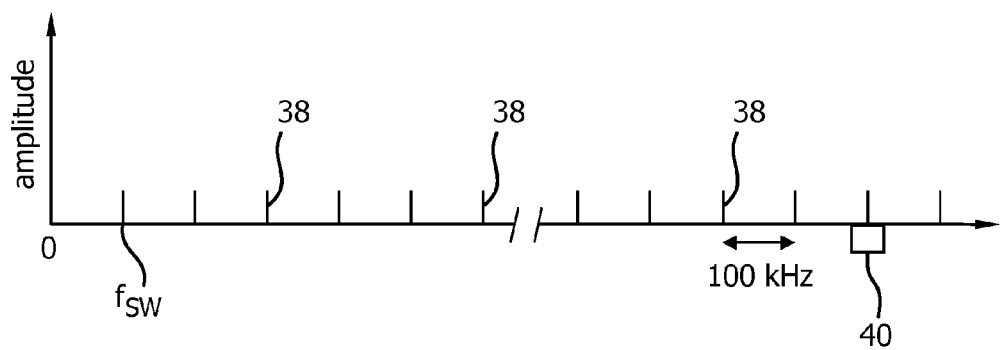
FIG. 3 illustrates conditions for interference between a higher harmonic of the fixed effective fundamental switching frequency of the power supply unit pursuant to FIGS. 1 and 2 with MR measurement signals.

As illustrated in FIG. 3, an output amplitude of the switched-mode power converter 134 operating at the first fundamental switching frequency $f_{SW}$ also contains harmonics 38 of the first fundamental switching frequency $f_{SW}$, the frequencies of which are integer multiples of the first fundamental switching frequency $f_{SW}$. Amplitudes of the harmonics 38 depend, according to the Fourier analysis theorem, on the exact waveform of the switched-mode power supply output, but shall not be considered in more detail herein.

The MR examination system 110 shown in FIG. 1 is designed to be used for a multi-species nuclei examination of $^1H$ and $^{14}N$ nuclei. In general, other selected species of nuclei, such as $^{13}C$ or $^{31}P$ may as well be examined in addition or alternatively. MR measurement signals acquired by the MR scanner 112 and sampled and processed by the MR system control unit 118 are contained in a multi-species nuclei receive band 40 with a 1 kHz-bandwidth (FIG. 3), centered about a frequency of 4.6 MHz (width of receive band 40 not to scale in FIG. 3).

With the Larmor frequency $f_L$ of the nuclei being proportional to the magnetic field strength and due to the temporal drift of the magnetic field strength of the main magnet 114, the receive band 40 will also drift during operating time of the MR scanner 112. Thus, one of the harmonics 38 of the first fundamental switching frequency $f_{SW}$ might fall within the receive band 40 to interfere with the MR measurement signals. This condition is indicated in FIG. 3.

As shown in FIG. 1, the MR system control unit 118 comprises an FFT (Fast Fourier Transformation) analyzer tool 122 for analyzing a frequency spectrum of the MR measurement signals and to determine an amplitude of a harmonic 38 of the first fundamental switching frequency $f_{SW}$ within the MR measurement receive band 40. The analyzer tool 122 comprises an output line 124 provided to transmit an output signal that corresponds to the amplitude of one of the harmonics 38 of the first fundamental switching frequency $f_{SW}$ within the MR measurement receive band 40.

The output line 124 is connected to an interference indication unit 144 of the power supply unit 130. The interference indication unit 144 is provided to receive the output signal of the analyzer tool 122 as an input signal via the output line 124. A pre-determined threshold is stored within a memory of the interference indication unit 144. The interference indication unit 144 is designed to generate a trigger signal 142 and to provide the trigger signal 142 to the pulse control unit 132 if the amplitude of the harmonic 38 of the first fundamental switching frequency $f_{SW}$ falling within the MR measurement receive band 40 exceeds a pre-determined threshold.

Figure 4:
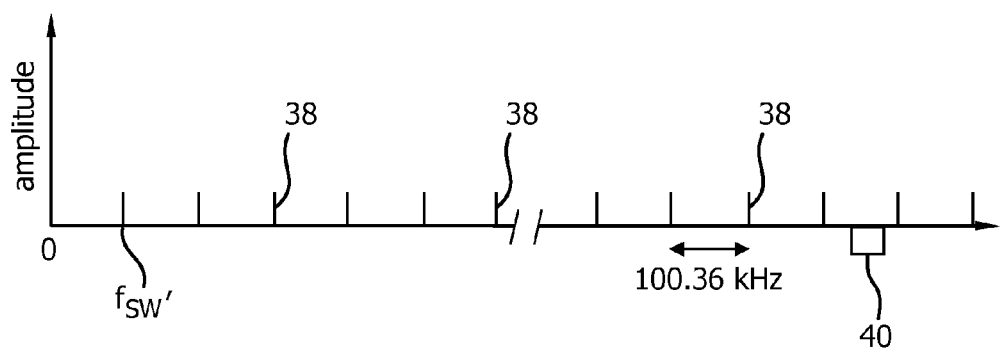
FIG. 4 illustrates an effect of the method of operating the power supply unit pursuant to FIGS. 1 and 2 and in accordance with the invention, so as to avoid the interference.

The pulse control unit 132 is provided, upon triggering by the trigger signal 142, to change the first fundamental switching frequency $f_{SW}$ to at least a second fundamental switching frequency $f_w'$ (FIG. 4). To this end, the pulse control unit 132 is equipped with a software module 152 (FIG. 1), in which steps of a method of operating the power supply unit 130 are converted into a program code that is implementable in and executable by the pulse control unit 132 of power supply unit 130.

The pulse control unit 132 is provided to determine an amount $\Delta f_{SW}$ for the first fundamental switching frequency $f_{SW}$ to be changed by, from the type of nucleus under examination, the strength of the static magnetic field strength of the main magnet 114, and the first fundamental switching frequency $f_{SW}$ according to the formula $$\Delta f_{SW} = (f_{SW})^2 / (f_L * N)$$

wherein N denotes the reciprocal of a portion of a frequency interval between two harmonics 38 of the first fundamental switching frequency $f_{SW}$. The type of nuclei and the strength of the magnet field of the main magnet 114 are, as described earlier, incorporated into the Larmor frequency $f_L$ of the nuclei.

With a first fundamental switching frequency $f_{SW}$ of 100 kHz, a Larmor frequency $f_L$ of 4.6 MHz and an arbitrary choice of N=6, the amount $\Delta f_{SW}$ for the first fundamental switching frequency $f_{SW}$ to be changed by results to be 362 Hz. In comparison to the first fundamental switching frequency $f_{SW}$, the amount $\Delta f_{SW}$ is quite small and thus no further requirements, for instance on bandwidth, are arising from this change for the switched-mode power converter 134.

Thus, upon being triggered by the trigger signal 142, the pulse control unit 132 is provided to change the first fundamental switching frequency $f_{SW}$ from 100 kHz to a second fundamental switching frequency $f_{SW}'$ of 100.362 kHz (FIG. 4). This will shift the harmonic 38 that falls within the receive band 40 by an amount $\Delta f_{SW}$ of $f_{SW}/N=16.7$ kHz. The result of the change of the first fundamental switching frequency $f_{SW}$ to the second fundamental switching frequency $f_{SW}'$ is illustrated in FIG. 4. The effect is clearly visible in comparison to the condition of the unchanged first fundamental switching frequency $f_{SW}$ shown in the FIG. 3.

If one of the harmonics 38 still falls into the receive band 40, the trigger signal 142 will be maintained by the analyzer tool 122 of the MR system control unit 118. In this case, the pulse control unit 132 is provided to change the first fundamental switching frequency $f_{SW}$ at least a second time by the pre-determined amount $\Delta f_{SW}$, so that the harmonic 38 that falls within the receive band 40 will be shifted by another 16.7 kHz. Usually, this will suffice to eliminate the interference, but depending on the selected value of N, the pulse control unit 132 is provided to shift the first fundamental switching frequency $f_{SW}$ more than twice until the desired result has been attained, controlled by the trigger signal 142 provided by the analyzer tool 122.

Figure 5:
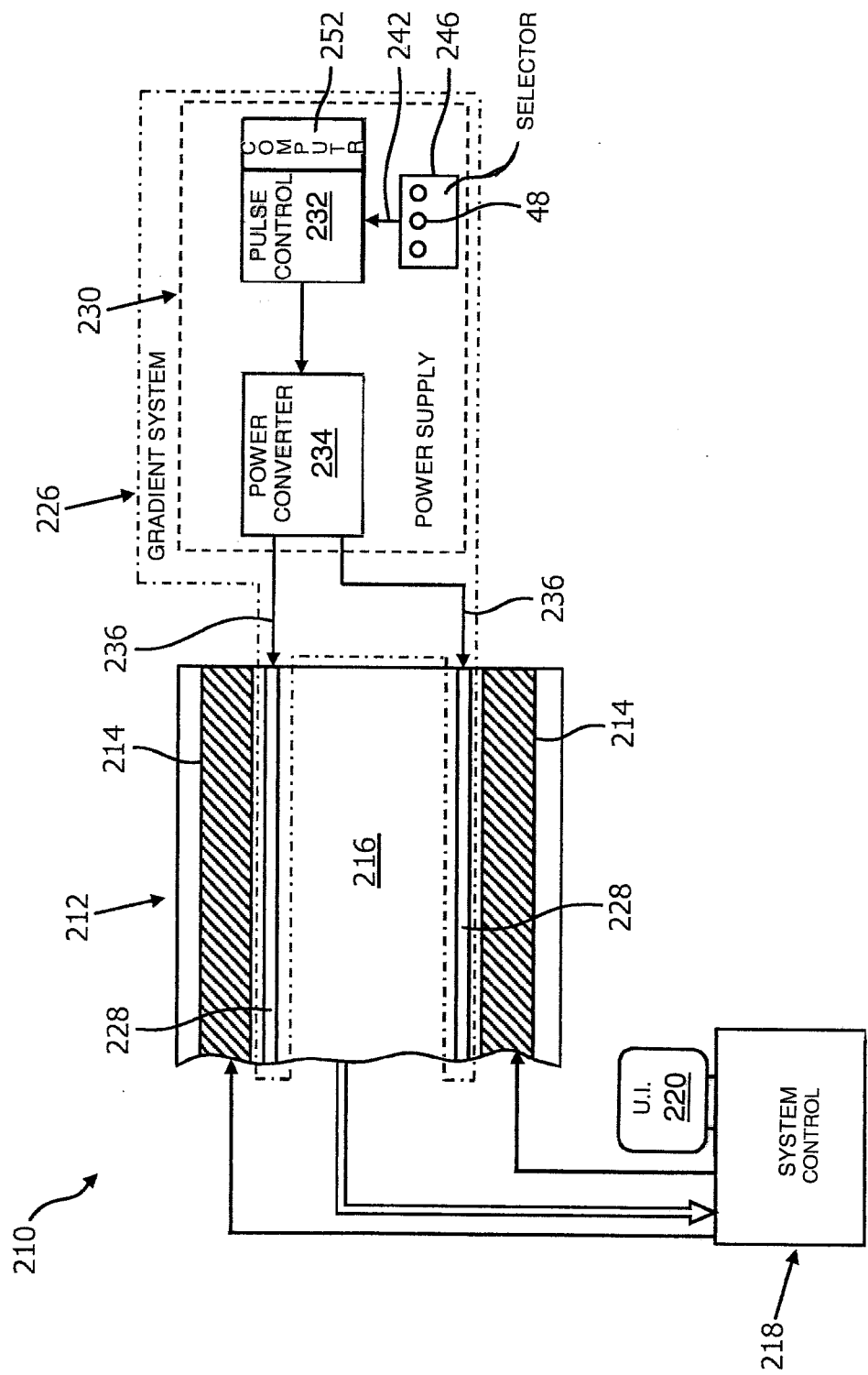
FIG. 5 shows an alternative embodiment of a power supply unit in accordance with the invention.

An alternative embodiment of the invention is illustrated in FIG. 5. In the alternative embodiment, the MR system control unit 218 does not comprise an analyzer tool with an output line, and the pulse control unit 232 is not provided to determine an amount $\Delta f_{SW}$ for the first fundamental switching frequency $f_{SW}$ to be changed by. Instead, the power supply unit 230 comprises a fundamental switching frequency selection unit 246 with three push buttons 48 corresponding to three different pre-selected fundamental switching frequencies $f_{SW}^{(i)}$, i=1-3, which can be activated by an operator. The fundamental switching frequency selection unit 246 is designed to provide a trigger signal 242 to the pulse control unit 232 to change the first fundamental switching frequency $f_{SW}$ to one of the pre-selected fundamental switching frequencies $f_{SW}^{(i)}$, i=1-3, which are known by experience to allow for stable operation, upon manual actuation of the fundamental switching frequency selection unit 246 by an operator. If a quality of MR measurement signals appears to be unsatisfying due to interference with one of the harmonics 38 of the first fundamental switching frequency $f_{SW}$, the operator can activate the fundamental switching frequency selection unit 246 to try one of the pre-selected fundamental switching frequencies $f_{SW}^{(i)}$, i=1-3, for better signal quality. In general, instead of a hardware fundamental switching frequency selection unit 246, a same function may be implemented as a software embodiment in the MR system control unit 218, with the selection members being designed as a software buttons on the monitoring unit 220.

Figure 6:
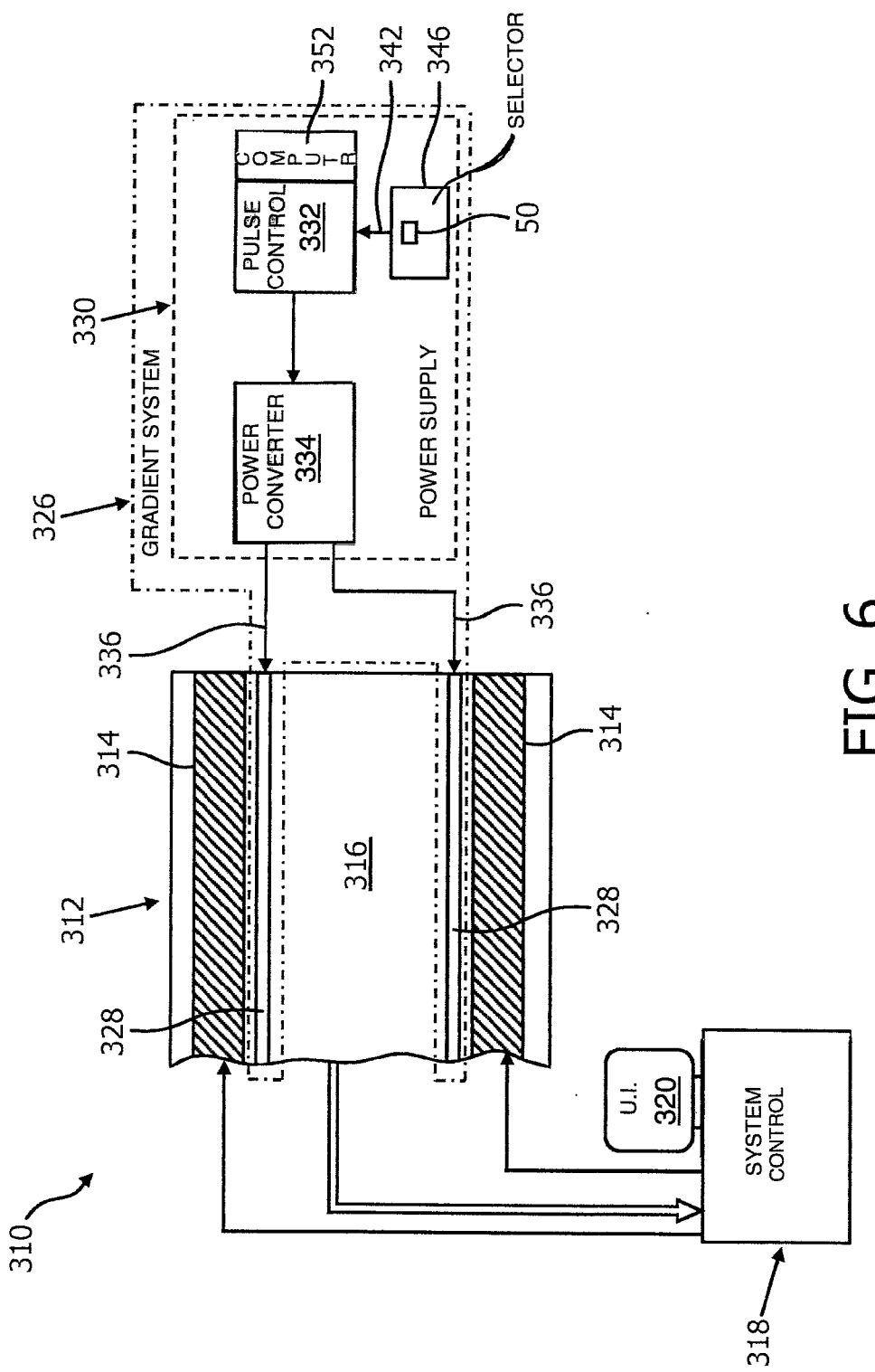
FIG. 6 illustrates yet another alternative embodiment of a power supply unit in accordance with the invention.

Another embodiment of the invention is identical to the second embodiment except for the fact that instead of the three push buttons 48, the fundamental switching frequency selection unit 346 comprises a selection member for selecting a fundamental switching frequency $f_{SW}$ that is designed as a momentary push button 50 (FIG. 6). Further, the pulse control unit 332 is provided, upon being triggered by a trigger signal 342, to change the first fundamental switching frequency $f_{SW}$ at a constant rate to a second fundamental switching frequency $f_{SW}'$. If an interference of a harmonic 38 of the first fundamental switching frequency $f_{SW}$ and the multi-species nuclei receive band 40 is detected or suspected, an operator can activate the selection member by pressing the momentary push button 50. The fundamental switching frequency selection unit 346 is designed to provide the trigger signal 342 to the pulse control unit 332 as long as the operator is activating the selection member, so as to change the first fundamental switching frequency $f_{SW}$ at the constant rate to a second fundamental switching frequency $f_{SW}'$, preferably with no interference occurring. In general, instead of a hardware fundamental switching frequency selection unit 346, a same function may be implemented as a software embodiment in the MR system control unit 318, with the selection member being designed as a software button on the monitoring unit 320.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance (MR) examination system
12 MR scanner
14 main magnet
16 region of examination
18 MR system control unit
20 monitoring unit
22 analyzer tool
24 output line
26 magnetic gradient system
28 gradient coil
30 power supply unit
32 pulse control unit
34 switched-mode power converter
36 output port
38 harmonic
40 multi-species nuclei receive band
42 trigger signal
44 interference indication unit
46 fundamental switching frequency selection unit
48 push button
50 momentary push button
52 software module
$f_{SW}$ fundamental switching frequency
$f_L$ Larmor frequency

The invention claimed is:
1. A power supply unit for powering at least one gradient coil of a magnetic resonance examination system with a main magnet having, in at least one state of operation, a substantially static magnetic field strength, and with a magnetic resonance measurement signal bandwidth, the power supply unit comprising:
a switched-mode power converter for powering the at least one gradient coil, comprising at least one switching member provided to switch between a conducting state configuration and an essentially non-conducting state configuration at a first fundamental switching frequency;
a pulse control unit designed to provide switching pulses at the first fundamental switching frequency for controlling the switching of the at least one switching member;
an interference indication unit provided to receive an input signal that corresponds to an amplitude of a harmonic of the first fundamental switching frequency within the magnetic resonance measurement signal bandwidth, and designed to generate a trigger signal and to provide the trigger signal to the pulse control unit if the amplitude of the harmonic exceeds a pre-determined threshold;

wherein, upon triggering by the trigger signal, the pulse control unit is provided to change the first fundamental switching frequency to at least a second fundamental switching frequency.

2. The power supply unit as claimed in claim 1, wherein the pulse control unit is provided to change the first fundamental switching frequency (fSW) at least twice by a pre-determined amount.

3. The power supply unit as claimed in claim 1, wherein the pulse control unit is provided to determine an amount for the first fundamental switching frequency to be changed by, from the type of nucleus under examination, the strength of the static magnetic field strength of the main magnet, and the first fundamental switching frequency.

4. A magnetic gradient system of a magnetic resonance examination system, comprising:
a main magnet;
at least one gradient coil; and
a power supply configured to power the at least one gradient coil, the power supply including:
a switched-mode power converter configured to power the at least one gradient coil, including at least one switching member configured to switch between a conducting state and an essentially non-conducting state at a first fundamental switching frequency,
a pulse controller configured provide switching pulses at the first fundamental switching frequency for controlling the switching of the at least one switch,
an interference indicator configured to receive an input signal that corresponds to an amplitude of a harmonic of the first fundamental switching frequency within a magnetic resonance measurement signal bandwidth, and to generate a trigger signal and to provide the trigger signal to the pulse controller in response to an amplitude of the harmonic exceeding a pre-determined threshold;
wherein, in response to triggering by the trigger signal, the pulse controller is configured to change the first fundamental switching frequency to at least a second fundamental switching frequency.

5. A method of operating a power supply unit, particularly for powering at least one gradient coil of a magnetic resonance examination system with a main magnet having, in at least one state of operation, a substantially static magnetic field strength and with a magnetic resonance measurement signal bandwidth, the power supply unit comprising
a switched-mode power converter for powering the at least one gradient coil, comprising at least one switching member provided to switch between a conducting state configuration and an essentially non-conducting state configuration at a first fundamental switching frequency;
a pulse control unit designed to provide switching pulses at the first fundamental switching frequency for controlling the switching of the at least one switching member;
wherein, upon triggering by a trigger signal, the pulse control unit is provided to change the first fundamental switching frequency at least to a second fundamental switching frequency, the method comprising the following steps:
determine an amplitude of a harmonic of the first fundamental switching frequency within the magnetic resonance measurement signal bandwidth;
provide a trigger signal to the pulse control unit if the amplitude of the harmonic exceeds a pre-determined threshold; and
upon being triggered by the trigger signal, the pulse control unit changes the first fundamental switching frequency at least to a second fundamental switching frequency.

6. A non-transitory computer-readable medium carrying software which when loaded on a computer processor controls at least one gradient coil of a magnetic resonance examination system with a main magnet having, in at least one state of operation, a substantially static magnetic field strength, and with a magnetic resonance measurement signal bandwidth, including:
powering the at least one gradient coil with at least one switch configured to switch between a conducting state configuration and an essentially non-conducting state configuration at a first fundamental switching frequency;
providing switching pulses at the first fundamental switching frequency for controlling the switching of the at least one switch;
receiving an input signal that corresponds to an amplitude of a harmonic of the first fundamental switching frequency within the magnetic resonance measurement signal bandwidth,
generating a trigger signal and providing the trigger signal to the switch if the amplitude of the harmonic exceeds a pre-determined threshold;
determining whether an amplitude of a harmonic of the first fundamental switching frequency is within the magnetic resonance measurement signal bandwidth;
in response to the amplitude of the harmonic exceeding a pre-determined threshold, changing the first fundamental switching frequency at least to a second fundamental switching frequency.

* * * * *